(12) United States Patent
Riches

(10) Patent No.: US 6,937,089 B2
(45) Date of Patent: Aug. 30, 2005

(54) OFFSET, DELAY AND PARASITICALLY IMMUNE RESISTER-CAPACITOR (RC) TRACKING LOOP AND METHOD OF USING SAME

(75) Inventor: James J. Riches, Lake Worth, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/748,878

(22) Filed: Dec. 30, 2003

(65) Prior Publication Data

US 2005/0140431 A1    Jun. 30, 2005

(51) Int. Cl.[7] ............................................... H03K 5/00
(52) U.S. Cl. ...................................... 327/553; 327/552
(58) Field of Search ................................ 327/552–559

(56) References Cited

U.S. PATENT DOCUMENTS

| | | | |
|---|---|---|---|
| 4,137,504 A | * | 1/1979 | Simmons ...................... 327/79 |
| 5,245,646 A | * | 9/1993 | Jackson et al. ................. 377/2 |
| 5,914,633 A | * | 6/1999 | Comino et al. ............. 327/553 |

OTHER PUBLICATIONS

Lindros, Saska et al., A 3-V Continuous-Time Filter with On-Chip Tuning for IS-95, IEEE Journal of Solid-State Circuits, vol. 34, No. 8, Aug. 1999, pp. 1150-1154.
Halonen, Kari et al., A 3V gm C-Filter with On-Chip Tuning for CDMA, IEEE 1997 Custom Integrated Circuits Conference, 1997, pp. 5.6.1-5.6.4.
Simon, M. K., The True Performance of the Simplified Data-Transition Tracking Loop, TDA Progress Report 42-31, Nov. 15, 1997, pp. 1-9.

* cited by examiner

*Primary Examiner*—Dinh T. Le
(74) *Attorney, Agent, or Firm*—Miller Johnson

(57) ABSTRACT

A resistor capacitor (RC) tracking loop includes a parasitic insensitive integrator (211) charged by a buffer (207) with offset compensation. The integrator (211) operates to provide an accurate ramped voltage proportional to a measured RC time constant. A single comparator (213) is used for sensing the voltage ramp rate by detecting two multiplexed reference voltages ($V_{REFLO}$ $V_{REFHI}$). A timer within controller (201) is triggered by the $V_{REFLO}$ crossing at comparator (213). The timer counts the number of precision reference clock periods ($F_{REF}$) that occur between the $V_{REFLO}$ and $V_{REFHI}$ crossings and adjusts an accumulator within controller (201) to a value (M). This value (M) is directly used to adjust a resistor and/or capacitor array used in a continuous time filter whose bandwidth and corner frequency can be precisely tuned.

13 Claims, 2 Drawing Sheets

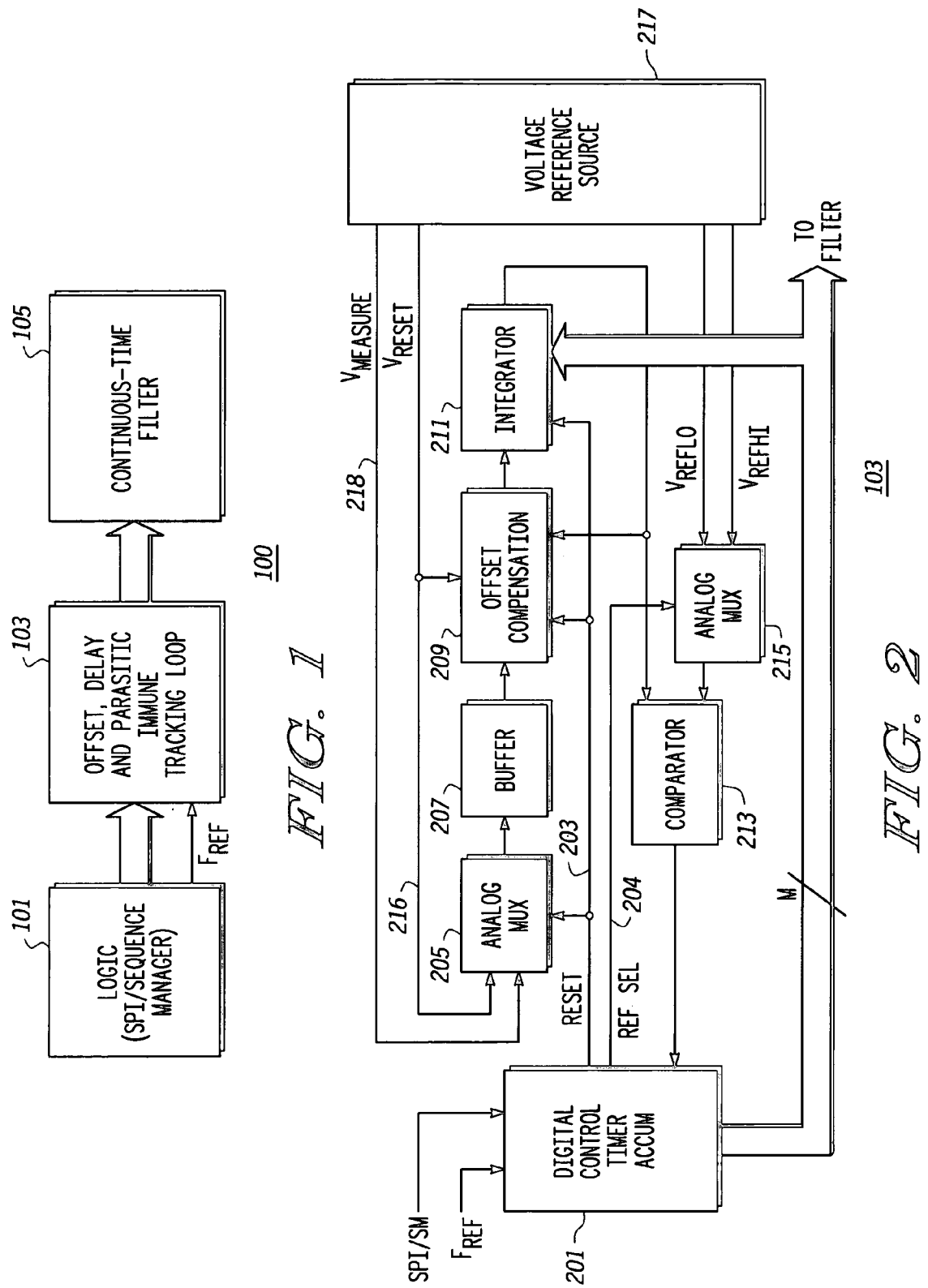

OFFSET, DELAY AND PARASITICALLY IMMUNE RESISTER-CAPACITOR (RC) TRACKING LOOP AND METHOD OF USING SAME

TECHNICAL FIELD

The present invention is directed to a resister capacitor (RC) tracking loop and more particularly to a highly effective RC tracking loop for tuning RC time constant variation due to both process discrepancy and temperature drift.

BACKGROUND

As is well known in the art, tracking loops are generally used to vary RC filter parameters which in the integrated circuit manufacturing process may vary as much as 35 percent from their nominal value. The tracking loop works to track this variation which can occur due to manufacture or temperature variation. This enables filter corner parameters to be easily adjusted to maintain some predetermined tolerance. More specifically, typical tracking loop circuits use a method of time-constant measurement that is not entirely immune from the effects of input offsets, comparator delay and/or component parasitics. The effect of these parasitics results in an error in the RC time-constant measurement, which in turn results in bandwidth error in any filter or other tuned circuit which the loop is intended to optimize.

Presently, prior art tracking loops use no offset or delay independent topology, which can be problematic in terms of the effect of circuit parasitics on the accuracy of the tracking loop. An example of a tracking loop design of this type is disclosed in IEEE 1997 Custom Integrated Circuits Conference publication entitled "A 3V $g_m$ C-Filter with On-Chip Tuning for CDMA," at pages 5.6.1–5.6.4.

Thus, the need exists for an optimal tracking loop topology that can take into account a very precise time reference, generated on-chip, using an accurate crystal oscillator. Preferably, the tracking loop should be able to tune either a resistor or capacitor in the filter or RC combination to obtain the desired nominal frequency response of the filter. The tuning loop can then be used to tune the response of any type of continuous-time filter.

SUMMARY OF THE INVENTION

The invention defines an RC tracking loop that utilizes an offset independent topology that is parasitically insensitive and easy to both implement and integrate with existing technology. The topology for the RC tracking loop allows extremely accurate RC time-constant measurements utilizing a high-resolution passive array. The invention resolves the problem associated with the effects of input offsets, comparator delay and/or component parasitics so as not to limit the effect of the high-resolution passive array. The invention accomplishes this by utilizing a comparator which recognizes that each comparator event occurs at different discrete moments in time. Since only one comparator in the tracking loop need be used to make decisions, this results in input offset cancellation between any two measurements. Moreover, by implementing input offset compensation using switched capacitor techniques, circuits using multiple operational amplifiers such as an integrator and unity buffer can be compensated using only a single capacitor and one compensation cycle.

BRIEF DESCRIPTION OF THE DRAWINGS

The features of the present invention, which are believed to be novel, are set forth with particularity in the appended claims. The invention, together with further objects and advantages thereof, may best be understood with reference to the following description, taken in conjunction with the accompanying drawings, in the several figures of which like reference numerals identify like elements, and in which:

FIG. 1 is a block diagram illustrating the typical location of a tracking loop as used with associated components in a digital communications system.

FIG. 2 is a block diagram illustrating the topology of the tracking loop in accordance with the preferred embodiment of the invention.

DETAILED DESCRIPTION OF THE PREFERRED EMBODIMENT

Figure 3:
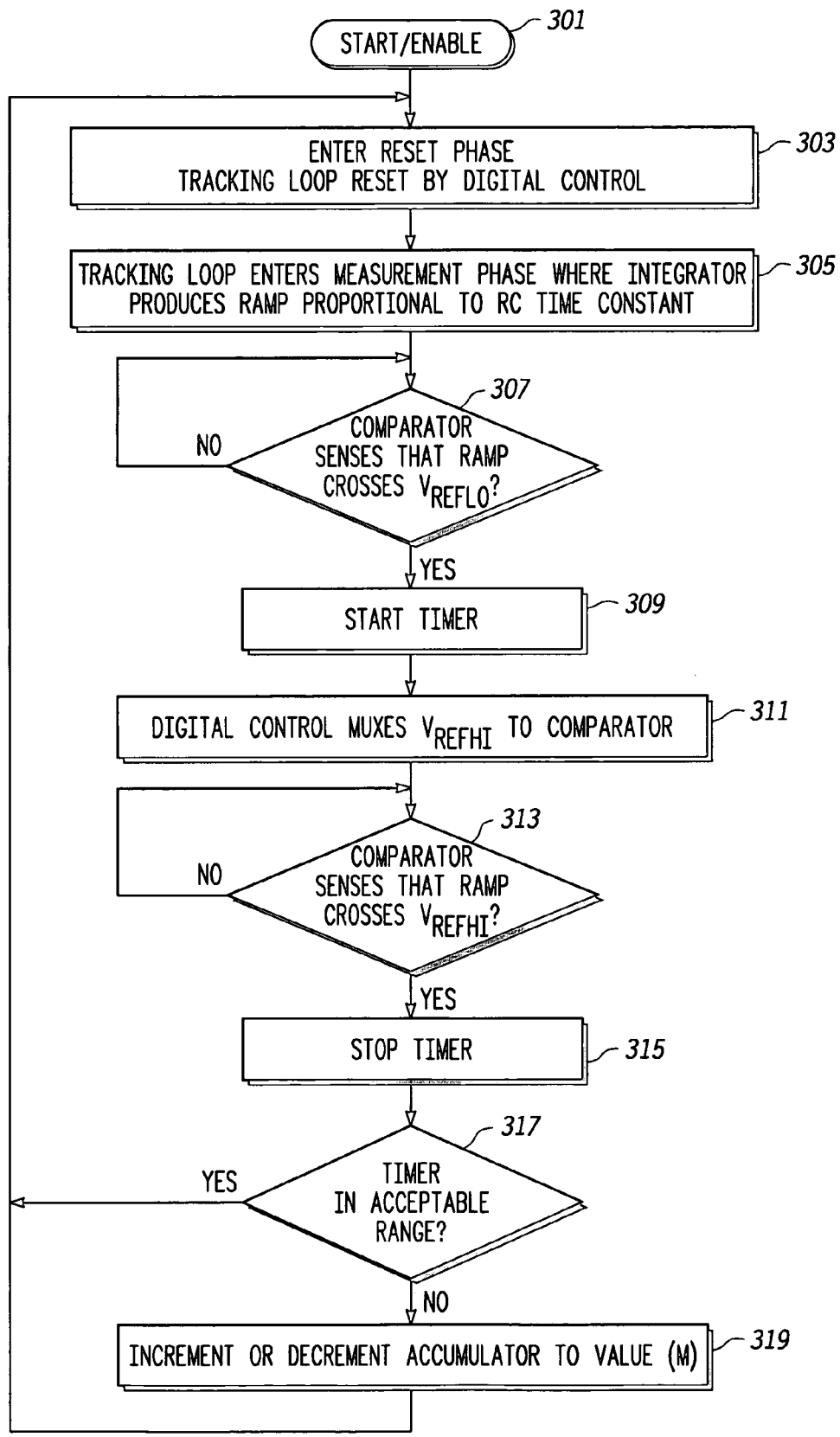
FIG. 3 is a flow chart diagram identifying the novel steps performed for tracking and compensating RC error in a continuous time filter using the preferred method of the invention.

While the specification concludes with claims defining the features of the invention that are regarded as novel, it is believed that the invention will be better understood from a consideration of the following description in conjunction with the drawing figures, in which like reference numerals are carried forward.

With regard to FIG. 1, a high level mixed mode type block diagram 100 depicts an offset, delay and parasitically immune RC tracking loop 103. The diagram illustrates the typical operation of a generic type digital control logic 101 which is controlled by either a sequence manager or a serial peripheral interface (SPI) port. A synchronization reference input signal is also used at the control input of tracking loop 103 and is produced using a frequency reference such as a precision clock source ($F_{REF}$).

An offset, delay and parasitic immune tracking loop 103 then uses both a data input from digital control logic 101 and synchronization reference input $F_{REF}$ to track and correct frequency offset in any type of tuned analog circuit requiring a tight frequency tolerance. These tuned circuits might include a low pass filter, high pass filter or a band pass continuous time filter circuit 105 as seen in FIG. 1. A continuous time filter circuit 105 is typically used in present day digital communications systems that utilize filters having a precise frequency response and corner frequency values.

FIG. 2 illustrates further detail of the features and operation of the tracking loop 103 as seen in FIG. 1. The block diagram shows the preferred system and method of the invention where a precision clock source ($F_{REF}$) controls all digital portions of the tracking loop 103 and provides timing operation and a cumulative value used to control the filter 105. Initially, a digital controller 201 initiates a reset phase by activating a digital control reset signal 203. The digital control reset signal 203 operates to initialize an analog multiplexer 205, offset compensation circuit 209 and a parasitic insensitive integrator 211. The reset phase is initiated using analog multiplexer 205 and an analog reset reference voltage 216 ($V_{RESET}$) produced by voltage reference 217. The reset reference voltage 216 passes through a buffer 207 and through integrator 211 via offset compensation circuit 209. The integrator 211 is configured in a unity-gain state during the reset phase using a transmission gate (not shown). The transmission gate operates by shunting an integration capacitor within the integrator 211. When in the reset phase, the resultant output of both the buffer 207 and the integrator 211 are directed to the offset compensation circuit 209.

During the reset phase, the offset compensation circuit 209 operates using a switched capacitor circuit that switches the output of buffer 207 to one side of an integrator compensation capacitor. The offset compensation circuit 209 also simultaneously switches the output of the unity gain configured integrator 211 to the opposite side of this compensation capacitor. Thus, during a subsequent measurement phase as discussed herein, the voltage resulting on this integrated compensation capacitor in the compensation circuit 209 represents a "correction voltage" that will be added to the output of buffer 207. This results in having no active offset affecting the RC time-constant measurement in integrator 211.

After the reset phase, the offset compensation circuit 209 and integrator 211 are then switched to a measurement phase by deactivating the digital control reset signal 203 produced by the digital controller 201 at which time the analog measure reference voltage 218 ($V_{MEASURE}$) is applied to the buffer 207 via analog multiplexer 205. Offset compensation is accomplished by switching an offset compensation integrated capacitor in series with integrator 211 such that the effect of any voltage offsets on the buffer 207 and the integrator 211 are effectively cancelled out. This permits the voltage from integrator 211 to "ramp up" in a linear fashion where this ramped voltage is proportional only to the value of the RC time-constant.

The tracking loop 103 uses both resistors and capacitors which are very well matched to those components used in the continuous time filter 105. Typically, the ramped voltage function created by the integrator 211 will be proportional to the corner frequency of the continuous time filter 105. A comparator 213 is used for sensing a lower voltage threshold during the measurement phase, it starts a timer located within the digital controller 201 where the timer is updated by a precision clock frequency reference. When the multiplexer 215 switches the reference voltage to comparator 213 to determine the higher threshold, it then continues measuring until that higher threshold is reached at which point it stops the timer.

Thus, when the comparator 213 senses a lower threshold voltage crossing, ($V_{REFLO}$), it signals the digital control logic 201. The digital control logic alerts the multiplexer 215 to switch to an alternative reference ($V_{REFHI}$) provided by voltage reference source 217. The comparator 213 then senses when the integrator 211 ramp voltage crosses the alternate reference $V_{REFHI}$. Multiplexer 215 operates to multiplex and control these two separate thresholds ($V_{REFLO}$ and $V_{REFHI}$) using a digital control reference select signal 204 (REF SEL) also provided by the digital controller 201. The comparator 213 receives this input from the analog multiplexer 215 where it detects these two separate voltage crossing events at two different points in time. Those skilled in the art will recognize that prior art tracking loops often utilize two comparators that act to accumulate this type of data. The use of two comparators most often presents error to any RC time constant measurement due to signal offset effects and delay.

In contrast, the present invention uses only a single comparator to sense both events, since these events occur at two separate points in time. This acts to apply the same delay and offset to each measurement, thereby canceling its effect from the RC time constant measurement.

At the end of the measurement phase, if the count of the timer is within a predetermined window of counts, that is the count is within a predetermined tolerance, then the circuit used in the RC tracking loop is considered to be "tuned."

Contrary to prior art RC topologies, the present invention works to measure and create a numerical value which represents how rapidly integrator 211 was ramped. If the count is outside some predetermined window of counts (a positive integer or zero), where this value might be either too great or too low, an accumulator internal to digital controller 201 will be either incremented or decremented to a value (M). The accumulator uses this data to send information to a capacitor and/or resister array within the continuous time filter 105. This data is then used to tune the RC parameters of the array which forms a portion of the continuous time filter 105. This enables the continuous time filter 105 to be precisely "tuned" to negate the adverse effects of component tolerance and temperature variation.

In addition, the present invention offers a further advantage since the digital controller 201 includes integrated functionality that includes loop control, a timer and accumulator, enabling the digital controller to maintain precise operational control over the tracking loop 103. Operationally, if during the measurement phase the continuous time filter is not tuned appropriately, the accumulator provides a value (M) representing the next best iteration for an optimal filter setting value. This value is used for adjusting any resistor or capacitor which may be tuned in the filter. By using RC combinations in integrator 211 that are closely matched to the resister and capacitor values in the continuous time filter 105, the accumulator in the digital controller 201 can continually adjust these values. Hence the tracking loop 103 of the present invention derives its name since it changes states or "loops" between a reset phase and measurement phase in a continual loop-like manner. Using this process, the tracking loop 103 does eventually converge on an optimal value (M) for tuning RC values within the continuous time filter 105.

Moreover, the present invention offers a number of other distinct advantages over prior art topologies since it achieves measurement accuracy by using only a single comparator to detect the RC time constant. This offers a great deal of immunity from parasitic induced delay and input offsets. The use of one comparator provides delay immunity since a single comparator presents the same delay to the measurement of both the low threshold $V_{REFLO}$ and the high threshold $V_{REFHI}$ reference voltages. This in turn has no impact on the timer count offering implicit immunity from delay. Finally, parasitic immunity is also provided since an integrator is used to measure the RC time-constant. The effects of the radio frequency (RF) parasitics on the tuned element whether they be a resistor or capacitor array are minimal in this design.

With regard to FIG. 3, a flow chart diagram is shown which depicts the preferred method of the invention. A tracking loop receives an enable signal 301, typically via SPI or sequence manager, to operationally start the tracking loop. The tracking loop is then reset 303 by a digital control signal ($V_{RESET}$). $V_{RESET}$ is an analog reset reference voltage that is applied to an integrator and buffer, which in turn updates the offset compensation for these components.

The tracking loop then enters a measure phase 305. In the measurement phase 305, a digital controller multiplexes an analog reference voltage ($V_{MEASURE}$) to a buffer, which charges the integrator through a resistor. The digital controller also simultaneously applies offset compensation to cancel any offsets of the buffer and the integrator. In response, the integrator produces a ramped output voltage that is proportional to the RC time constant. Initially when the ramped voltage begins, a comparator waits until it senses 307 if the integrator's output crosses a low voltage reference value ($V_{REFLO}$) where the low voltage reference value is supplied to the comparator from a source of reference voltages.

The comparator will continue to measure this voltage and if it does cross the low voltage threshold it will initialize 309 a timer within the digital controller. The digital controller will then multiplex 311 a high voltage reference ($V_{REFHI}$) to the comparator. The comparator continues to measure until it senses 313 a second or higher threshold crossing at the high voltage reference threshold. The timer will then be stopped 315 to determine 317 if the timer count is within a predetermined range. If the timer is outside that range, it will increment or decrement 319 an accumulator located in the digital controller. The accumulator will be incremented or decremented depending upon whether the timer count was too low or high. If the timer count is within an acceptable range, then a determination is made that the continuous time filter is considered "tuned" which will bypass the accumulation stage and again count until it is disabled.

Hence, when the comparator senses that the ramp voltage crosses a predetermined threshold, it stops the timer. If the timer count ends within an acceptable range, the preferred method of the invention begins again where the tracking loop is reset 303. If the timer count is outside the acceptable range then the timer increments or decrements an accumulator to a value (M). The value within the accumulator is then used to adjust a resistor and/or capacitor bank within the continuous time filter. This enables any filter such as one used in a cellular or radio communications system to be precisely tuned to a center frequency or edge corner frequency enabling the filter to meet any number of communications protocol requirements.

In conclusion, the present invention defines a novel RC tracking loop and method that allows extremely accurate RC time constant measurements using a high-resolution passive array. Any tuned circuit such as a continuous time filter can be precisely tuned using the invention to negate the effects of manufacturing intolerances or parameter changes due to temperature variation.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A resister capacitor (RC) tracking loop comprising:
   an integrator charged by at least one buffer for providing a ramped voltage output proportional to a measured RC time constant;
   a comparator for sensing both the ramped voltage output from the integrator and a plurality of reference signals;
   a timer activated by the comparator for counting a time period between predetermined events;
   an accumulator for adjusting at least one component network in a continuous time filter when the timer is outside a predetermined range; and
   wherein the timer is activated when the ramped voltage output from the integrator crosses a first predetermined voltage level and deactivated when the integrator crosses a second predetermined voltage level.

2. The RC tracking loop as in claim 1, further comprising:
   a transmission-gate for resetting at least one capacitor in the integrator; and
   wherein the integrator is placed into a unity-gain mode for the purpose of sensing an input offset voltage.

3. The RC tracking loop as in claim 1, wherein the accumulator is incremented or decremented by the timer.

4. The RC tracking loop as in claim 1, wherein the component network is used to alter an RC time constant within the continuous time filter.

5. The RC tracking loop as in claim 1, further comprising:
   offset compensation circuitry for altering the RC time constant between the at least one buffer and integrator.

6. The RC tracking loop as in claim 1, wherein the at least one buffer and integrator are initialized using a digital controller.

7. A resister capacitor (RC) tracking loop used to adjust a continuous time filter in a digital communications system comprising:
   a controller;
   a buffer supplied with a control signal from the controller;
   an integrator for providing a ramp output signal proportional to an RC time constant of a charge voltage supplied from the buffer;
   a comparator for comparing the ramp output signal and a multiplexed voltage reference signal;
   a timer activated by the comparator;
   an accumulator controlled by the timer which is incremented or decremented based upon whether a timer count falls within a predetermined range; and
   wherein the timer is started and stopped based upon the ramp output signal crossing a plurality of threshold levels.

8. An RC tracking loop as in claim 1, wherein the accumulator controls a tuning network in a continuous time filter for adjusting continuous time filter RC time constants.

9. An RC tracking loop as in claim 7, wherein the comparator cancels out comparator delay and offset.

10. An RC tracking loop as in claim 8, wherein an offset compensation circuit is switched in series between the buffer and integrator for canceling input offsets of both the buffer and integrator.

11. An RC tracking loop as in claim 8, wherein the multiplexed voltage reference signal is comprised of a substantially low reference voltage ($V_{REFLO}$) and a substantially high reference voltage ($V_{REFLO}$).

12. A method for adjusting a continuous time filter using an RC tracking loop comprising the steps of:
   charging an integrator in the RC tracking loop using at least one buffer;
   providing a ramped output voltage from the integrator that is proportional to the RC time constant used in the RC tracking loop;
   comparing the ramped output voltage from the integrator with a first predetermined reference voltage;
   initiating a timer when the ramped output voltage crosses the first predetermined reference voltage;
   stopping the timer when the ramped output voltage crosses a second predetermined reference voltage;
   measuring a time count for determining if the timer counter is within a predetermined range;
   resetting a buffer and integrator if the timer count is within a predetermined range; and
   adjusting an accumulator if the timer count is outside the predetermined range.

13. A method for adjusting a continuous time filter as in claim 12, further comprising the step of:
   adjusting a value of a tuning network in the continuous time filter based upon an incremented or decremented value in the accumulator.

* * * * *